United States Patent
Rogers et al.

(10) Patent No.: US 11,323,126 B1
(45) Date of Patent: May 3, 2022

(54) DUAL OSCILLATOR PARTIAL-NETWORKING CONTROLLER AREA NETWORK CLOCK GENERATOR USING A PRECISION RESISTOR REFERENCE

(71) Applicant: DELPHI TECHNOLOGIES IP LIMITED, St. Michael (BB)

(72) Inventors: Steven H. Rogers, Kokomo, IN (US); Jack L. Glenn, Union Pier, MI (US)

(73) Assignee: Delphi Technologies IP Limited, St. Michael (BB)

( * ) Notice: Subject to any disclaimer, the term of this patent is extended or adjusted under 35 U.S.C. 154(b) by 0 days.

(21) Appl. No.: 17/242,426

(22) Filed: Apr. 28, 2021

(51) Int. Cl.
  *H03L 7/099* (2006.01)
  *G06F 1/08* (2006.01)
(52) U.S. Cl.
  CPC ............... *H03L 7/099* (2013.01); *G06F 1/08* (2013.01)
(58) Field of Classification Search
  CPC ...................................... H03L 7/099
  USPC .......................................... 331/2
  See application file for complete search history.

(56) References Cited

U.S. PATENT DOCUMENTS

| | | | |
|---|---|---|---|
| 7,162,342 B2* | 1/2007 | Ishida | ............... B60R 21/01516 701/45 |
| 7,230,497 B1* | 6/2007 | Leonard | .................. H03L 7/143 331/10 |
| 8,750,351 B2* | 6/2014 | Muth | ...................... H04L 12/12 375/219 |
| 9,471,528 B2* | 10/2016 | Muth | .................. G06F 13/4072 |
| 9,509,321 B2 | 11/2016 | Deval et al. | |
| 10,452,504 B2 | 10/2019 | Elend et al. | |
| 10,707,877 B1 | 7/2020 | Majumder et al. | |
| 2020/0363828 A1 | 11/2020 | Komoriyama et al. | |

* cited by examiner

*Primary Examiner* — Joseph Chang
(74) *Attorney, Agent, or Firm* — Bookoff McAndrews, PLLC; Joshua M. Haines

(57) ABSTRACT

An electronic circuit includes a first pin corresponding to a reference signal and a second pin corresponding to an external resistor, the external resistor being connected on a first side to the second pin and connected on a second side to ground. The apparatus also includes a first oscillator having a first frequency loop configured to: receive, via the first pin, the reference signal; receive, via the second pin, a current associated with voltage applied to the external resistor; and lock a first frequency output at a frequency associated with the reference signal. The apparatus also includes a second oscillator having a second frequency loop configured to: receive the first frequency output; scale the frequency of the first frequency output; and lock a second frequency output at the scaled frequency of the first frequency output.

20 Claims, 5 Drawing Sheets

DUAL OSCILLATOR PARTIAL-NETWORKING CONTROLLER AREA NETWORK CLOCK GENERATOR USING A PRECISION RESISTOR REFERENCE

TECHNICAL FIELD

This disclosure relates to vehicle circuits, and in particular, to systems and apparatuses for partial-networking controller area network clock generation.

BACKGROUND

Vehicles, such as cars, trucks, sport utility vehicles, cross-overs, mini-vans, or other suitable vehicles, typically include a computing environment comprising various computing devices, such as microcontrollers and/or other computing devices, for controlling and/or monitoring various aspects of such vehicles. Electronic communication between computing devices in the computing environment may be implemented using a high speed controller area network communication link, such as a partial-networking controller area network (PN-CAN).

Typically, timing requirements for such a communication link, in order to operate within specification, may include a high accuracy requirement (e.g., ~0.5%) and/or a fast clock requirement (e.g. greater than 6 megahertz). Such accuracy requirements may depend on performance capabilities of various transceiver blocks within a corresponding vehicle. In addition, the PN-CAN may use message decoding features, which may require a clock generator capable of operating during standby operation of the vehicle, while using minimal current.

SUMMARY

This disclosure relates generally to vehicle computing environments.

An aspect of the disclosed embodiments includes an apparatus. The apparatus includes an electronic circuit that includes a first pin corresponding to a reference signal and a second pin corresponding to an external resistor, the external resistor being connected on a first side to the second pin and connected on a second side to ground. The apparatus also includes a first oscillator having a first frequency loop configured to: receive, via the first pin, the reference signal; receive, via the second pin, a current associated with voltage applied to the external resistor; and lock a first frequency output at a frequency associated with the reference signal. The apparatus also includes a second oscillator having a second frequency loop configured to: receive the first frequency output; scale the frequency of the first frequency output; and lock a second frequency output at the scaled frequency of the first frequency output.

Another aspect of the disclosed embodiments includes an electronic circuit for generating a partial-networking controller area network clock. The electronic circuit includes a first pin configured to receive, from a remote microcontroller, a reference signal and a second pin corresponding to an external precision resistor, the external precision resistor being connected on a first side to the second pin and connected on a second side to ground. The electronic circuit also includes a low frequency oscillator having a first frequency loop configured to: receive, via the first pin, the reference signal; receive, via the second pin, a current associated with voltage applied to the external precision resistor; and lock a first frequency output at a frequency associated with the reference signal. The electronic circuit also includes a high frequency oscillator having a second frequency loop configured to: receive the first frequency output; scale the frequency of the first frequency output; and lock a second frequency output at the scaled frequency of the first frequency output.

These and other aspects of the present disclosure are provided in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
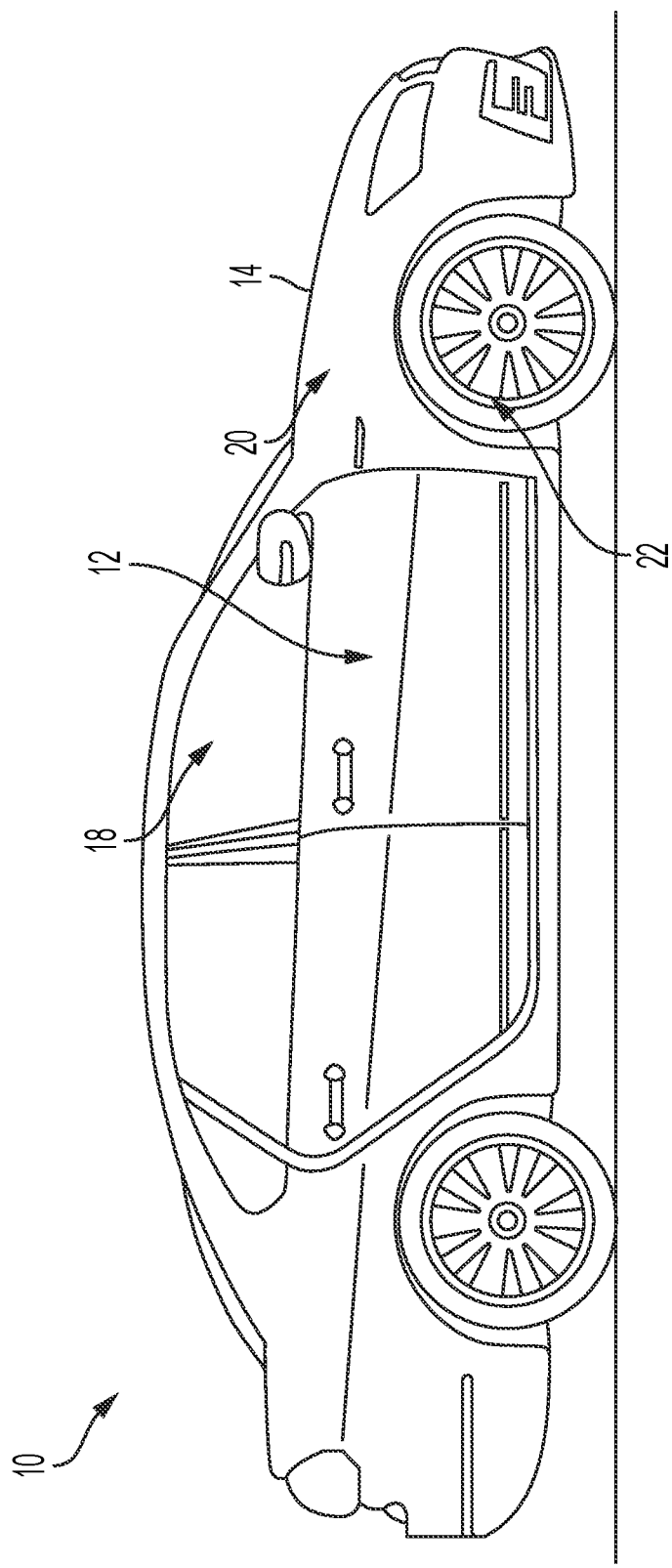
FIG. 1 generally illustrates a vehicle according to the principles of the present disclosure.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, vehicles, such as cars, trucks, sport utility vehicles, cross-overs, mini-vans, or other suitable vehicles, typically include a computing environment comprising various computing devices, such as microcontrollers and/or other computing devices, for controlling and/or monitoring various aspects of such vehicles. Electronic communication between computing devices in the computing environment may be implemented using a high-speed controller area network communication link, such as a PN-CAN.

Typically, timing requirements for such a communication link, in order to operate within specification, may include a high accuracy requirement (e.g., ~0.5%) and/or a fast clock requirement (e.g. greater than 6 megahertz). Such accuracy requirements may depend on performance capabilities of various transceiver blocks within a corresponding vehicle. In addition, the PN-CAN may use message decoding features, which may require a clock generator capable of operating during standby operation of the vehicle, while using minimal current.

However, typical oscillators may not satisfy such requirements due to insufficient accuracy and/or a lack of a reference during standby operation of the vehicle. To account for these requirements, various techniques may be employed to generate internal clocks. Typical clock generators used for CAN communication can be primarily classified as resonator or phase locked loop (PLL) clock generators. For example, one technique for clock generation may use one or more crystals or ceramic resonators. Additionally, such a technique may include relatively simple buffered oscillators. Typically, clock generation using a crystal resonator may be relatively accurate and may include a two-pin interface as well as other components. However, clock generators that use a crystal resonator may be cost prohibitive. While ceramic resonators may be less cost prohibitive and may start operating relatively quickly, ceramic resonators may provide insufficient accuracy. Further, ceramic resonators may interface with an associated integrated circuit (IC) using two pins and may require additional components Another typical technique used for clock generation includes using a phase or frequency locked loop. For example, a control loop or adjustment may be used to modify resistance or current provided to a resistance-capacitance (RC) oscillator. Such a technique may generate the clock frequency based on an available precision frequency reference or data information received from the communication link. Further, such a technique may lock onto a corresponding frequency source to provide the desired clock at the required frequency.

Typically, when employing such techniques, PN-CAN devices may be programmed to receive a wake-up message. That wake-up message may include fixed timing properties that may be extracted by a corresponding controller or processor (e.g., that receives the wake-up message). Additionally, or alternatively, the wake-up message may include expected bit patterns that provide not just data, but also provide timing information. Starting bits and other components may include a fixed time duration and pattern.

Such a technique may measure or synchronize this information to allow the creation of a clock signal (e.g., an actual clock and/or a correction factor that the digital component may use for timing). Using a wakeup message on the communication link for a frequency reference may be convenient to support low power modes where no other ICs are operating or available to provide a frequency reference. Using the communication link as the frequency reference may also be relatively passive until a clock is required, which may avoid wasting power on a running clock. A hardware control loop may generate an actual clock signal using the wake-up message. A digital or software implementation alternative may recalculate bit timing and/or corrections for communication over the communication link (e.g., the PN-CAN).

However, such techniques do not account for temperature drift, aging, lack of reference, and/or power usage. Further, the suitability of such a technique depends on many factors, including the available references and power moding. In addition, internal RC oscillators operating over 10 megahertz may have inefficient temperature performance, while parasitic resistance and capacitance may produce temperature coefficient (TC) related frequency drift. The phase and frequency locked loops using a fixed frequency reference may not properly operate when their reference is turned off in standby modes because the loops correct a large TC. PN-CAN systems typically require operation in low power modes (e.g., in a shutdown mode).

Accordingly, systems and apparatuses, such as those described herein that provide clock generation using a reference signal, while controlling TC related drift, may be desirable. In some embodiments, the systems and the apparatus described herein may be configured to provide an electrical circuit (e.g., include an application specific integrated circuit (ASIC) or other suitable circuit) for the computing environment of a vehicle. The systems and apparatuses described herein may be configured to provider an oscillator function for the PN-CAN communication link having a desired clock frequency (e.g., between 5 megahertz and 40 megahertz, or other suitable clock frequency). The systems and apparatuses described herein may be configured to provide clock generation in and out of standby operation of the vehicle with desired accuracy (e.g., 0.3% to 0.7% accuracy or other suitable accuracy) in a cost-effective manner. The systems and apparatuses described herein may be configured to use a single external precision resistor and an external reference received from or corresponding to a microprocessor. The reference signal may be any suitable frequency, such as 100 hertz or other suitable frequency. The frequency from the microcontroller may correspond to a crystal of the microcontroller.

In some embodiments, the systems and apparatuses described herein may be configured to provide an accurate clock in standby low power operation of the vehicle (e.g., maintaining a 0.5% specification over temperature in standby operation, enabled by using the precision resistor).

In some embodiments, the systems and apparatuses described herein may include a first pin corresponding to a reference signal and a second pin corresponding to an external resistor. The external resistor may include a precision resistor. The external resistor may be connected on a first side to the second pin and connected on a second side to ground. The systems and apparatuses described herein may include a first oscillator having a first frequency loop. The first oscillator may include a low frequency oscillator. The first frequency loop may be configured to receive, via the first pin, the reference signal. The first frequency loop may be further configured to receive, via the second pin, a current associated with voltage applied to the external resistor. The first frequency loop may be further configured to lock a first frequency output at a frequency associated with the reference signal. In some embodiments, the first frequency loop includes at least a time shared switched mirror divider. The time shared switched mirror divider includes an input mirror reference connected to a plurality of field-effect transistor drains. In some embodiments, the frequency of the second frequency output is greater than the frequency of the first frequency output. In some embodiments, the first oscillator may be configured to reject a reference signal having a frequency outside of a frequency range.

The systems and apparatuses described herein may include a second oscillator having a second frequency loop configured to receive the first frequency output. The second oscillator may include a high frequency oscillator. The second frequency loop may be further configured to scale the frequency of the first frequency output. The second frequency loop may be further configured to lock a second frequency output at the scaled frequency of the first frequency output.

In some embodiments, the first oscillator may receive the reference signal in response to an ignition switch of a corresponding vehicle being in an on position. In some embodiments, the second oscillator may be configured to maintain the frequency of the second frequency output in response to an absence of the reference signal. In some embodiments, the reference signal corresponds to a remotely located microcontroller. In some embodiments, the first oscillator, the second oscillator, and the remotely located microcontroller are disposed in the vehicle.

FIG. 1 generally illustrates a vehicle 10 according to the principles of the present disclosure. The vehicle 10 may include any suitable vehicle, such as a car, a truck, a sport utility vehicle, a mini-van, a cross-over, any other passenger vehicle, any suitable commercial vehicle, or any other suitable vehicle. While the vehicle 10 is illustrated as a passenger vehicle having wheels and for use on roads, the principles of the present disclosure may apply to other vehicles, such as planes, boats, trains, drones, or other suitable vehicles. The vehicle 10 includes a vehicle body 12 and a hood 14. A portion of the vehicle body 12 defines a passenger compartment 18. Another portion of the vehicle body 12 defines the engine compartment 20. The hood 14 may be moveably attached to a portion of the vehicle body 12, such that the hood 14 provides access to the engine compartment 20 when the hood 14 is in a first or open position and the hood 14 covers the engine compartment 20 when the hood 14 is in a second or closed position.

The passenger compartment 18 is disposed rearward of the engine compartment 20. The vehicle 10 may include any suitable propulsion system including an internal combustion engine, one or more electric motors (e.g., an electric vehicle), one or more fuel cells, a hybrid (e.g., a hybrid vehicle) propulsion system comprising a combination of an internal combustion engine, one or more electric motors, and/or any other suitable propulsion system. In some embodiments, the vehicle 10 may include a petrol or gasoline fuel engine, such as a spark ignition engine. In some embodiments, the vehicle 10 may include a diesel fuel engine, such as a compression ignition engine. The engine compartment 20 houses and/or encloses at least some components of the propulsion system of the vehicle 10. Additionally, or alternatively, propulsion controls, such as an accelerator actuator (e.g., an accelerator pedal), a brake actuator (e.g., a brake pedal), a steering wheel, and other such components are disposed in the passenger compartment 18 of the vehicle 10. The propulsion controls may be actuated or controlled by a driver of the vehicle 10 and may be directly connected to corresponding components of the propulsion system, such as a throttle, a brake, a vehicle axle, a vehicle transmission, and the like, respectively. In some embodiments, the propulsion controls may communicate signals to a vehicle computer (e.g., drive by wire) which in turn may control the corresponding propulsion component of the propulsion system.

In some embodiments, the vehicle 10 includes a transmission in communication with a crankshaft via a flywheel or clutch or fluid coupling. In some embodiments, the transmission includes a manual transmission. In some embodiments, the transmission includes an automatic transmission. The vehicle 10 may include one or more pistons, in the case of an internal combustion engine or a hybrid vehicle, which cooperatively operate with the crankshaft to generate force which is translated through the transmission to one or more axles which turns wheels 22. When the vehicle 10 includes one or more electric motors, a vehicle battery and/or fuel cell provides energy to the electric motors to turn the wheels 22. In cases where the vehicle 10 includes a vehicle battery to provide energy to the one or more electric motors, when the battery is depleted, it may be connected to an electric grid (e.g., using a wall socket) to recharge the battery cells. Additionally, or alternatively, the vehicle 10 may employ regenerative braking which uses the one or more electric motors of the vehicle 10 as a generator to convert kinetic energy lost due to decelerating back into stored energy in the battery.

The vehicle 10 may include automatic vehicle propulsion systems, such as a cruise control, an adaptive cruise control, automatic braking control, other automatic vehicle propulsion systems, or a combination thereof. The vehicle 10 may be an autonomous or semi-autonomous vehicle, or other suitable type of vehicle. The vehicle 10 may include additional or fewer features than those generally illustrated and/or disclosed herein.

In some embodiments, the vehicle 10 may include a communication link, such as a PN-CAN. The communication link may be configured to allow various controllers, processors, sensors, other computing devices, and the like to communicate via the communication link. As described, the vehicle 10 may include an electronic circuit, such as an electronic circuit 200 as generally illustrated in FIG. 2, configured to provide clock generation for use in communication via the communication link.

In some embodiments, the circuit 200 includes a first frequency control loop 202 and a second frequency control loop 204. The first frequency control loop 202 may include low frequency control loop or other suitable control loop. The second frequency control loop 204 may include a high frequency control loop or other suitable control loop. In some embodiments, the first frequency control loop 202 may be adjusted to a first locked frequency. The first locked frequency may include any suitable frequency, such as a frequency within a range from 20 kilohertz to 50 kilohertz or other suitable frequency. The second frequency control loop 204 may be adjusted to a second locked frequency. The second locked frequency may include any suitable frequency, such as a frequency within a range from 5 megahertz to 40 megahertz or other suitable frequency.

Figure 2:
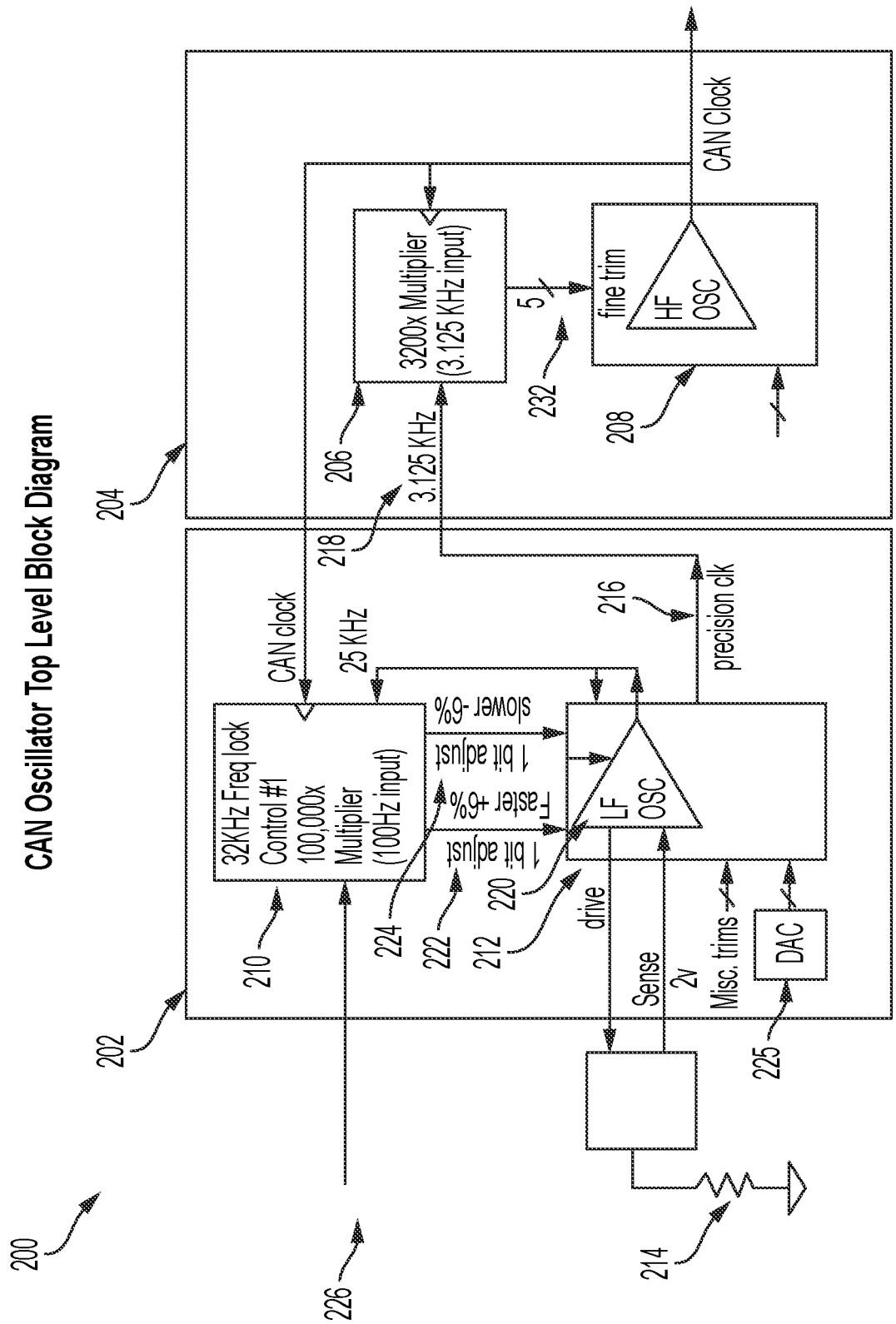
FIG. 2 generally illustrates a controller area network electronic circuit according to the principles of the present disclosure.
Figure 4:
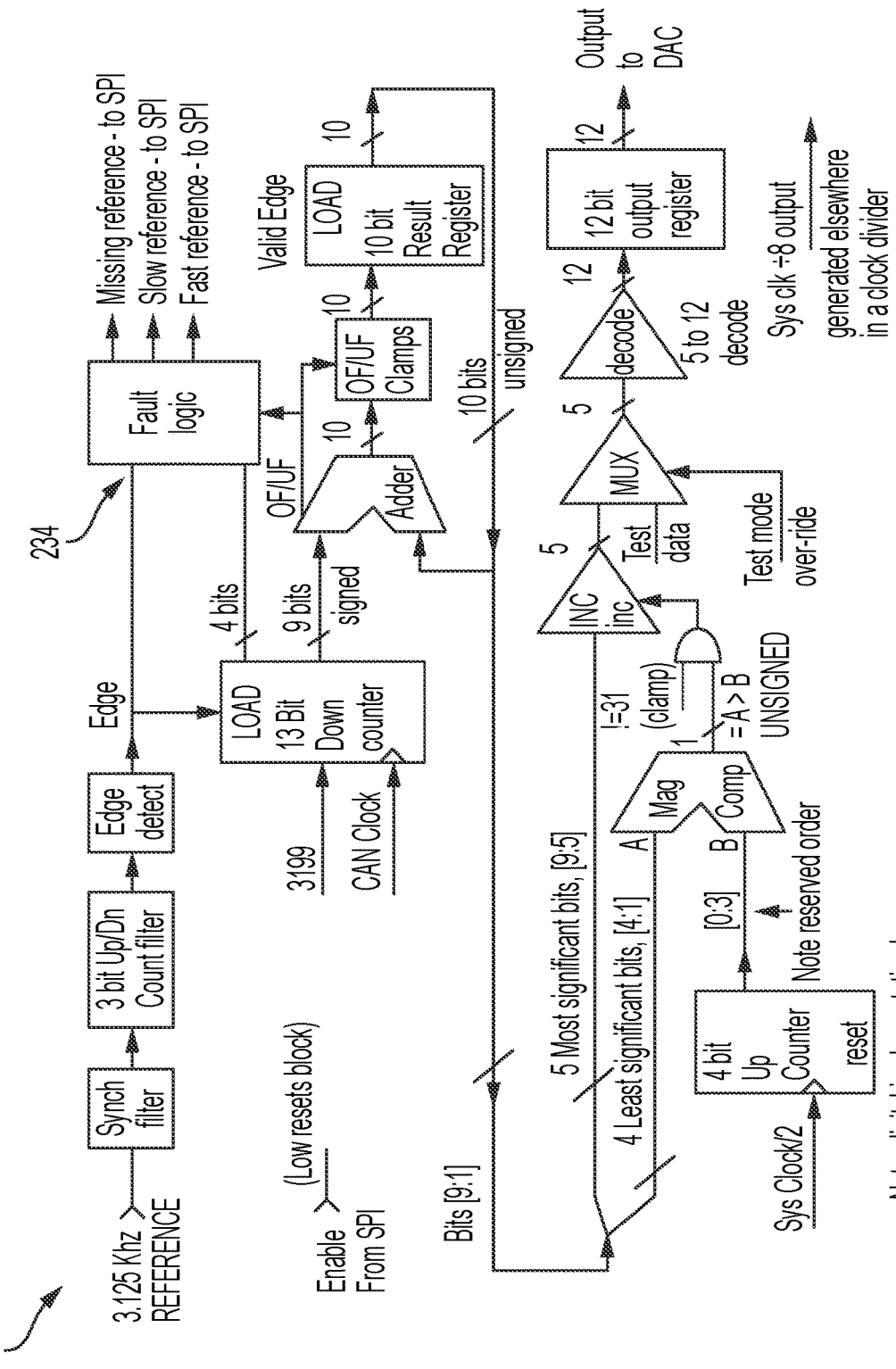
FIG. 4 generally illustrates a high frequency oscillator digital control loop according to the principles of the present disclosure.

In some embodiments, the second frequency control loop 204, as is generally illustrated in FIGS. 2 and 4, may include a digital control 206 as part of the second frequency control loop 204. The digital control 206 may be locked to frequency reference (e.g., a relatively accurate and relatively lower frequency reference). The second frequency control loop 204 may include an analog component 208. The analog component 208 may include resistance-capacitance oscillator controlled by the digital control 206. The analog component 208 may use an internal resistor based current that switches voltage on a pair of capacitors from supply to a voltage signal above ground.

In some embodiments, the analog component 208 may be adjusted to the second locked frequency. However, the analog component 208 may include a TC on its frequency drift (e.g., ~4% or 6 sigma process capability index), in an absence of a reference frequency (e.g. caused by parasitic resistors and capacitors in the high frequency switching circuits (buffers and logic gates), resistor TC variation, and/or mirror mismatch). Accordingly, the digital control 206 may be adjusted to a predefined number of counts (e.g., 3200 counts or other suitable number of counts) and the analog component 208 may be re-centered to the second locked frequency.

In some embodiments, to address the temperature drift caused by the parasitic resistors and capacitors in the analog component 208, the first frequency control loop 202 may include a low frequency oscillator 212, which may provide a low power frequency reference (e.g., 25 kilohertz or other suitable frequency). The low frequency oscillator 212 may be less susceptible to temperature drift from parasitic resistors and capacitors than the analog component 208. For example, while effects of parasitic resistors and capacitors may be present in the low frequency oscillator 212, delays through buffers account for a relatively smaller percentage of the period, with the frequency being 400× slower (e.g., 10,000,000/25,000).

The low frequency oscillator 212 may include a supply rejection. For example, the low frequency oscillator 212 may be configured to reduce or eliminate TC drift from the parasitic resistors and capacitors in standby operation of the vehicle 10 when a reference signal (e.g. having a frequency of 100 hertz or other suitable frequency) from a remotely located microcontroller (e.g., remotely located within the vehicle 10 from the circuit 200) is not present.

In some embodiments, the circuit 200 may include an external resistor 214. The external resistor 214 may include any suitable resistor. For example, the external resistor may include a precision resistor having a resistance value between 10 kilo-Ohms and 25 kilo-Ohms, or other suitable resistance value. The external resistor 214 may be connected on one side of the external resistor 214 to a pin of the circuit 200 and connected on another side of the external resistor 214 to ground.

In some embodiments, a current may be generated in the external resistor 214 by forcing a voltage (e.g., a 2 volt voltage or other suitable voltage) across the external resistor 214. The circuit 200 may be configured to mirror the current generated in the external resistor 214. It should be understood that the accuracy of the voltage applied to the external resistor 214 (e.g., and accordingly the current generated in the external resistor 214) may vary without departing from the scope of the systems and apparatuses described herein as long as the voltage tracks the frequency of the low frequency oscillator 212 supply. The external resistor 214 may be configured to reduce or eliminate operation issues associated with internal resistors of the circuit 200.

Figure 5:
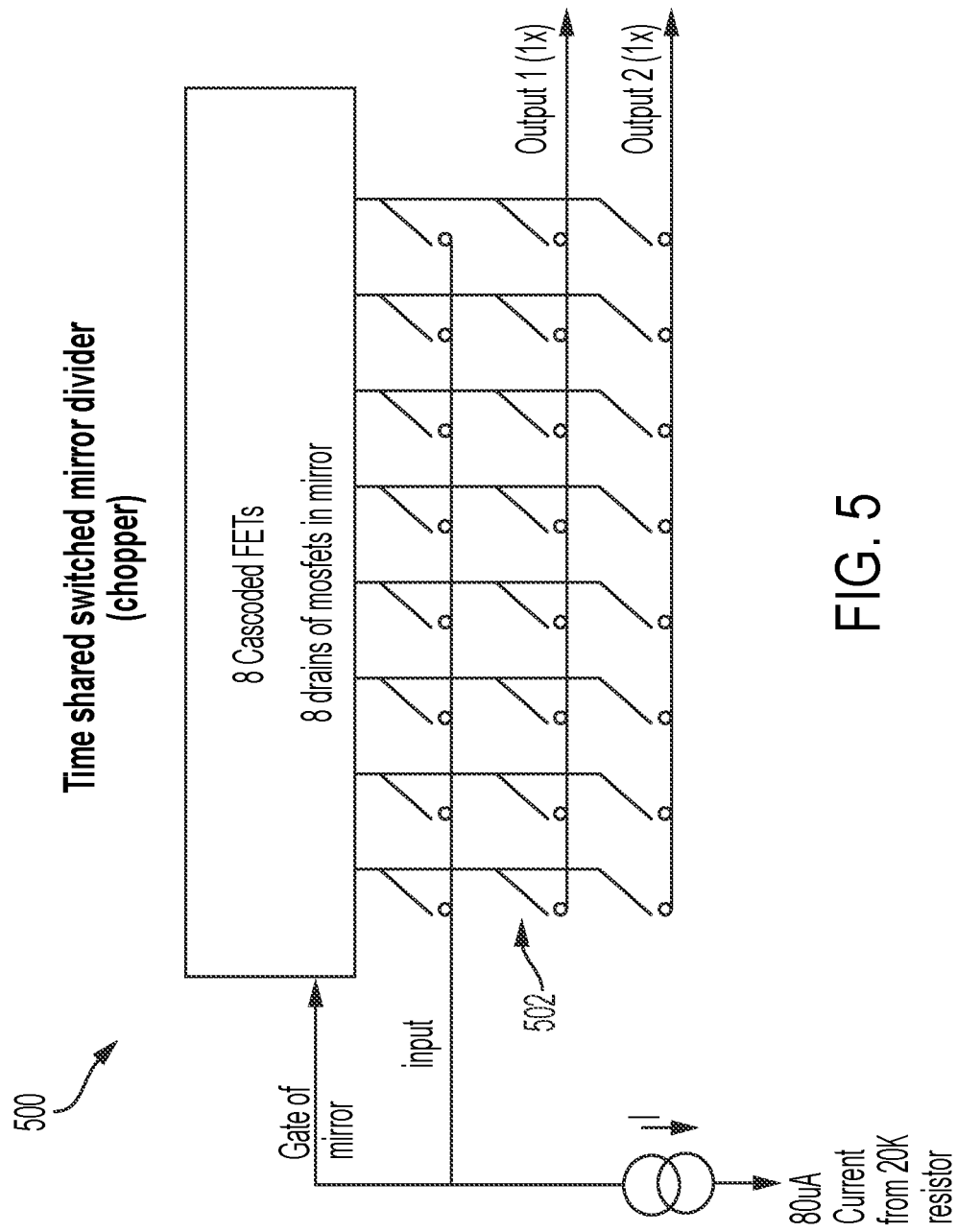
FIG. 5 generally illustrates a time shared switched mirror divider according to the principles of the present disclosure.

The low frequency oscillator 212 may include a current sink (e.g. such as a 2.2 microamp sink or other suitable sink) and may include a similar current source. The circuit 200 may include a current mirror 500, such as a divide by 36 mirror (e.g., responsive to a resistance value of the external resistor 214) or other suitable mirror, as is generally illustrated in FIG. 5. The mirror 500 may include a plurality of switches 502 configured to shift references to generate the mirror outputs (e.g., and vice versa) at periodic intervals. Each device in the mirror 500 time-shares at each position of the mirror 500, which may allow any mismatch to average out over the period it takes to occupy all positions in the mirror 500. In some embodiments, the time to average out any mismatch may include eight clock cycles or other suitable clock cycles. The number of clock cycles may be equal to the number of metal-oxide-semiconductor field-effect transistors (MOSFET).

In some embodiment, the mirror 500 may operate, by switching reference devices in the mirror 500 in a time-shared manner, at 25 kilohertz or other suitable frequency. Each stage (e.g., p type stages or other suitable type stages) divides the current received at the pin, which is connected to the external resistor 214, by a factor, such as six or other suitable factor, with a number of outputs (e.g., such as two outputs or other suitable number of outputs) using a total of 8 cascoded MOSFETS with 24 switches. The mirror 500 may include two mirror stages to achieve a divide by 36 operation. The two mirror stages may include a p-channel and an n-channel, being substantially identical, except for the p and n characteristics thereof. After the division of 36, a sink current may be mirrored by a similar 1× time shared manner to generate a source current for the low frequency oscillator 212 use with the other sink.

The circuit 200 may be configured to remove jitter at the first locked frequency by dividing the frequency 216 by the number of stages in mirror 500. The circuit 200 may be configured to use the eight devices in each stage of the p-channel and the n-channel of the mirror 500 to generate a clock frequency 218 (e.g., of 3.125 kilohertz (3125 hertz) or other suitable frequency) without jitter. The frequency 216 may provide a reference for the analog component 208.

In some embodiments, the low frequency oscillator 212 may use a +/−1-bit digital to analog converter (DAC) 220 to modify the current in the mirror 500, at a resolution of the second locked frequency. The digital control loop 210 may include a digital control bit 222 (e.g., which may be referred to as a fast bit) to add an amount of current and another digital control bit 224 (e.g., which may be referred to as a slow bit) to subtract an amount current in the mirror 500. The digital control loop 210 may be configured to adjust a percentage of time that the current addition and subtraction adjustments are made over the period to precisely control the frequency.

In some embodiments, control values may be observed (e.g., manually or by a suitable processor, such as those described herein) by measuring changes in the frequency 218 (e.g., which may be precise because the digital control loop 210 includes a resolution of one clock of the second locked frequency of the frequency 218 period or one part in 3200). In some embodiments, the low frequency oscillator 212 may be trimmed using three frequency measurements. Additionally, or alternatively, the first frequency control loop 202 may include a coarse trim DAC 225 that may be configured to fix current from the external resistor 214, by setting the voltage across the external resistor 214.

Figure 3:
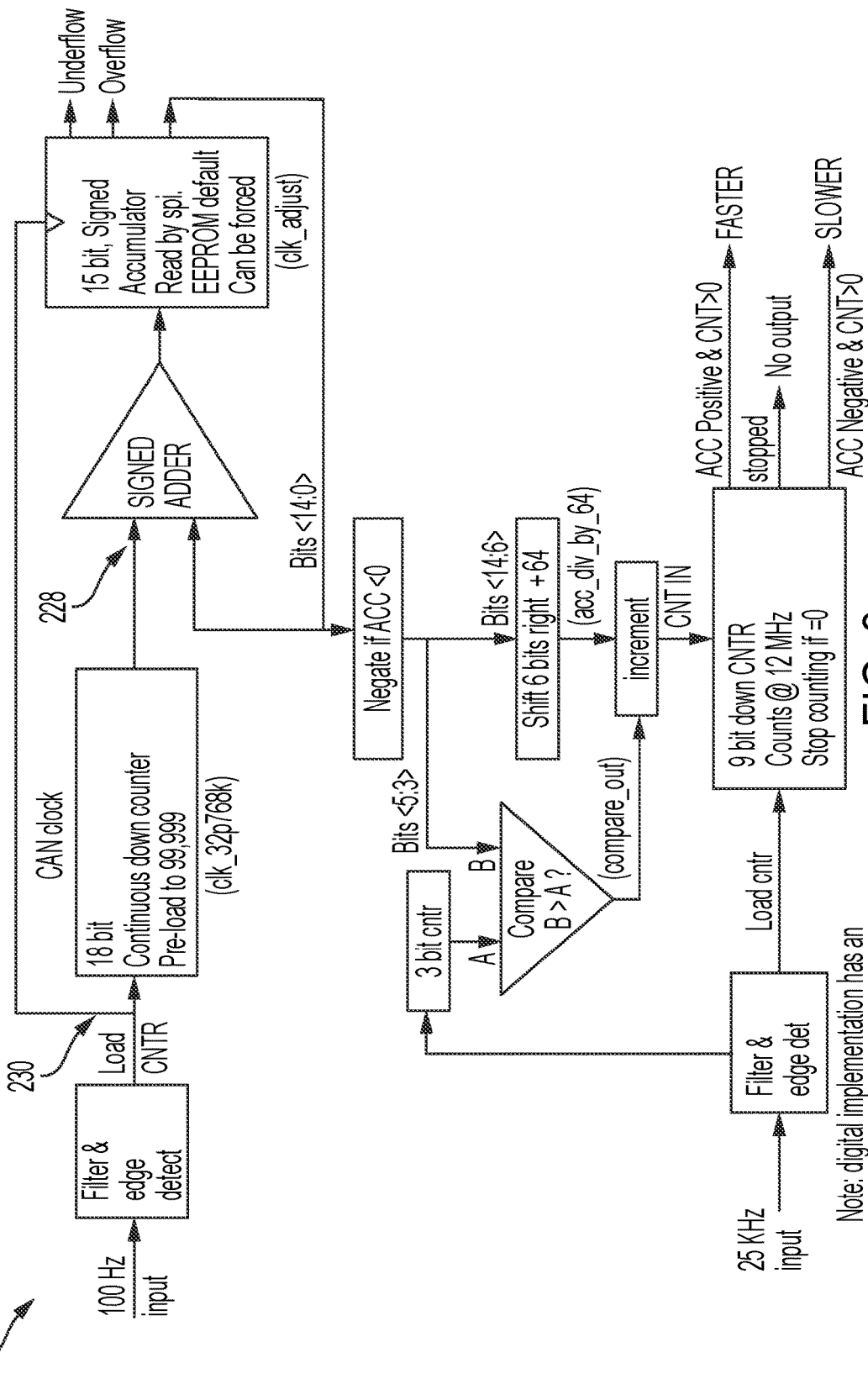
FIG. 3 generally illustrates a low frequency oscillator digital control loop according to the principles of the present disclosure.

In some embodiments, the low frequency oscillator 212 may be frequency locked to a reference frequency received from the remotely located microcontroller. For example, the low frequency oscillator 212 may receive, at a pin of the first frequency control loop 202, a reference signal 226 indicating the reference frequency. The reference frequency may include any suitable frequency, such as 100 hertz. The first frequency control loop 202 may receive the reference signal 226 in response to an ignition switch of the vehicle 10 being engaged (e.g., turned to an on position or closed). The low frequency oscillator 212 may be set to the reference frequency using the digital control loop 210 of the first frequency control loop 202. As is illustrated in FIG. 3, the first frequency control loop 202 may include a +/−1-bit DAC and no dither. The first frequency control loop 202 may include an integrator using an adder 228 and a divider 230 (e.g., with may include a 100,000 count divider or other suitable divider). Any long-term aging will be corrected each time the oscillator leaves standby mode.

In some embodiments, second frequency control loop 204 may be further configured to scale the frequency 218. For example, the digital control 206 may be configured to multiply the frequency 218 by a factor, as described. The digital control 206 may auto adjust the frequency control 232. The analog component 208 may be configured to generate a second locked frequency of the second frequency control loop 204 at the scaled frequency CAN clock. The analog component 208 may provide the second locked frequency to various microcontrollers on the PN-CAN network. The various microcontrollers may use the second locked frequency as the PN-CAN clock.

In some embodiments, the analog component 208 may be configured to maintain the second locked frequency in response to an absence of the reference signal 226. For example, in response to the ignition switch being turned off or actuated to an open position, the reference signal 226 may disengage and no long be available at the pin of the first frequency control loop 202. The digital control 206 may include a fault logic component 234, as is generally illustrated in FIG. 4. The fault logic component 234 may be configured to identify a missing reference frequency, a slow reference frequency, and a high reference frequency. If the fault logic component 234 identifies a received reference frequency (e.g., received from the first frequency control loop 202), as a missing reference frequency, a slow reference frequency, or a high reference frequency, the analog component 208 maintains the second locked frequency.

In some embodiments, an apparatus includes an electronic circuit that includes a first pin corresponding to a reference signal and a second pin corresponding to an external resistor, the external resistor being connected on a first side to the second pin and connected on a second side to ground. The apparatus also includes a first oscillator having a first frequency loop configured to: receive, via the first pin, the reference signal; receive, via the second pin, a current associated with voltage applied to the external resistor; and lock a first frequency output at a frequency associated with the reference signal. The apparatus also includes a second oscillator having a second frequency loop configured to: receive the first frequency output; scale the frequency of the first frequency output; and lock a second frequency output at the scaled frequency of the first frequency output.

In some embodiments, the first frequency loop includes at least a time shared switched current mirror divider. In some embodiments, the time shared switched mirror divider includes an input current mirror reference connected to a plurality of field-effect transistor drains. In some embodiments, the frequency of the second frequency output is greater than the frequency of the first frequency output. In some embodiments, the electronic circuit is associated with a partial networking controller area network. In some embodiments, the reference signal corresponds to a remotely located microcontroller. In some embodiments, the electronic circuit and the remotely located microcontroller are disposed in a vehicle. In some embodiments, the electronic circuit is configured to reject a reference signal having a frequency outside of a frequency range. In some embodiments, the electronic circuit receives the reference signal in response to an ignition switch being in an on position. In some embodiments, the electronic circuit is configured to maintain the frequency of the second frequency output in response to an absence of the reference signal. In some embodiments, the electronic circuit includes an application specific integrated circuit. In some embodiments, the external resistor includes a precision resistor. In some embodiments, the first oscillator includes a low frequency oscillator. In some embodiments, the second oscillator includes a high frequency oscillator.

In some embodiments, an electronic circuit for generating a partial-networking controller area network clock includes a first pin configured to receive, from a remote microcontroller, a reference signal and a second pin corresponding to an external precision resistor, the external precision resistor being connected on a first side to the second pin and connected on a second side to ground. The electronic circuit also includes a low frequency oscillator having a first frequency loop configured to: receive, via the first pin, the reference signal; receive, via the second pin, a current associated with voltage applied to the external precision resistor; and lock a first frequency output at a frequency associated with the reference signal. The electronic circuit also includes a high frequency oscillator having a second frequency loop configured to: receive the first frequency output; scale the frequency of the first frequency output; and lock a second frequency output at the scaled frequency of the first frequency output.

In some embodiments, the frequency of the second frequency output is greater than the frequency of the first frequency output. In some embodiments, the low frequency oscillator is configured to reject a reference signal having a frequency outside of a frequency range. In some embodiments, the low frequency oscillator receives the reference signal in response to an ignition switch being in an on position. In some embodiments, the high frequency oscillator is configured to maintain the frequency of the second frequency output in response to an absence of the reference signal. In some embodiments, the low frequency oscillator includes at least a first power time shared switched mirror divider.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations of the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described to allow easy understanding of the present disclosure and do not limit the present disclosure. On the contrary, the disclosure is intended to cover various modifications and equivalent arrangements included within the scope of the appended claims, which scope is to be accorded the broadest interpretation to encompass all such modifications and equivalent structure as is permitted under the law.

What is claimed is:

1. An apparatus comprising:
   an electronic circuit that includes:
   a first pin corresponding to a reference signal;
   a second pin corresponding to an external resistor, the external resistor being connected on a first side to the second pin and connected on a second side to ground;
   a first oscillator having a first frequency loop configured to:
   receive, via the first pin, the reference signal;
   receive, via the second pin, a current associated with voltage applied to the external resistor; and
   lock a first frequency output at a frequency associated with the reference signal; and
   a second oscillator having a second frequency loop configured to:
   receive the first frequency output;
   scale the frequency of the first frequency output; and
   lock a second frequency output at the scaled frequency of the first frequency output.

2. The apparatus of claim 1, wherein the first frequency loop includes at least a time shared switched mirror divider.

3. The apparatus of claim 2, wherein the time shared switched mirror divider includes an input mirror reference connected to a plurality of field-effect transistor drains.

4. The apparatus of claim 1, wherein the frequency of the second frequency output is greater than the frequency of the first frequency output.

5. The apparatus of claim 1, wherein the electronic circuit is associated with a partial networking controller area network.

6. The apparatus of claim 1, wherein the reference signal corresponds to a remotely located microcontroller.

7. The apparatus of claim 6, wherein the electronic circuit and the remotely located microcontroller are disposed in a vehicle.

8. The apparatus of claim 1, wherein the electronic circuit is configured to reject a reference signal having a frequency outside of a frequency range.

9. The apparatus of claim 1, wherein the electronic circuit receives the reference signal in response to an ignition switch being in an on position.

10. The apparatus of claim 1, wherein the electronic circuit is configured to maintain the frequency of the second frequency output in response to an absence of the reference signal.

11. The apparatus of claim 1, wherein the electronic circuit includes an application specific integrated circuit.

12. The apparatus of claim 1, wherein the external resistor includes a precision resistor.

13. The apparatus of claim 1, wherein the first oscillator includes a low frequency oscillator.

14. The apparatus of claim 1, wherein the second oscillator includes a high frequency oscillator.

15. An electronic circuit for generating a partial-networking controller area network clock, the electronic circuit comprising:
   a first pin configured to receive, from a remote microcontroller, a reference signal;
   a second pin corresponding to an external precision resistor, the external precision resistor being connected on a first side to the second pin and connected on a second side to ground;
   a low frequency oscillator having a first frequency loop configured to:
   receive, via the first pin, the reference signal;
   receive, via the second pin, a current associated with voltage applied to the external precision resistor; and
   lock a first frequency output at a frequency associated with the reference signal; and
   a high frequency oscillator having a second frequency loop configured to:
   receive the first frequency output;
   scale the frequency of the first frequency output; and
   lock a second frequency output at the scaled frequency of the first frequency output.

16. The electronic circuit of claim 15, wherein the frequency of the second frequency output is greater than the frequency of the first frequency output.

17. The electronic circuit of claim 15, wherein the low frequency oscillator is configured to reject a reference signal having a frequency outside of a frequency range.

18. The electronic circuit of claim 15, wherein the low frequency oscillator receives the reference signal in response to an ignition switch being in an on position.

19. The electronic circuit of claim 15, wherein the high frequency oscillator is configured to maintain the frequency of the second frequency output in response to an absence of the reference signal.

20. The electronic circuit of claim 15, wherein the low frequency oscillator includes at least a first power time shared switched mirror divider.

* * * * *